(12) United States Patent
Hunt et al.

(10) Patent No.: US 11,205,559 B2
(45) Date of Patent: Dec. 21, 2021

(54) SYSTEM AND METHOD FOR ALIGNMENT OF CATHODOLUMINESCENCE OPTICS

(71) Applicant: Gatan, Inc., Pleasanton, CA (US)

(72) Inventors: John Andrew Hunt, Fremont, CA (US); Michael Bertilson, Dublin, CA (US)

(73) Assignee: GATAN, INC., Pleasanton, CA (US)

( * ) Notice: Subject to any disclaimer, the term of this patent is extended or adjusted under 35 U.S.C. 154(b) by 0 days.

(21) Appl. No.: 17/077,217

(22) Filed: Oct. 22, 2020

(65) Prior Publication Data

US 2021/0125807 A1 Apr. 29, 2021

Related U.S. Application Data

(60) Provisional application No. 62/924,891, filed on Oct. 23, 2019.

(51) Int. Cl.
| | |
|---|---|
| *H01J 37/22* | (2006.01) |
| *H01J 37/20* | (2006.01) |
| *H01J 37/244* | (2006.01) |
| *H01J 37/29* | (2006.01) |

(52) U.S. Cl.
CPC ............ *H01J 37/228* (2013.01); *H01J 37/20* (2013.01); *H01J 37/244* (2013.01); *H01J 37/29* (2013.01); *H01J 2237/0492* (2013.01); *H01J 2237/2808* (2013.01); *H01J 2237/2826* (2013.01)

(58) Field of Classification Search
CPC ........ H01J 37/228; H01J 37/20; H01J 37/244; H01J 37/29; H01J 2237/0492; H01J 2237/2808; H01J 2237/2826; H01J 2237/21; H01J 37/26; H01J 2237/024; H01J 2237/2445; H01J 2237/202; G01N 23/2254; G01N 23/2204; G01N 2223/08; G01N 2223/102; G01N 2223/104; G01N 2223/303

See application file for complete search history.

(56) References Cited

U.S. PATENT DOCUMENTS

| | | | |
|---|---|---|---|
| 2013/0140459 A1* | 6/2013 | Galloway | H01J 37/28 250/310 |
| 2013/0141803 A1* | 6/2013 | Galloway | H01J 37/26 359/726 |
| 2019/0348257 A1* | 11/2019 | Hunt | H01J 37/261 |
| 2021/0125807 A1* | 4/2021 | Hunt | H01J 37/20 |

FOREIGN PATENT DOCUMENTS

| | | | | |
|---|---|---|---|---|
| EP | 2450935 A2 * | 5/2012 | ............ | H01J 37/244 |
| EP | 2991097 A1 * | 3/2016 | ............ | H01J 37/226 |
| WO | WO-2018025849 A1 * | 2/2018 | ............ | H01J 37/28 |

* cited by examiner

Primary Examiner — David A Vanore
(74) Attorney, Agent, or Firm — Volpe Koenig

(57) ABSTRACT

Systems and methods for automated alignment of cathodoluminescence (CL) optics in an electron microscope relative to a sample under inspection are described. Accurate placement of the sample and the electron beam landing position on the sample with respect to the focal point of a collection mirror that reflects CL light emitted by the sample is critical to optimizing the amount of light collected and to preserving information about the angle at which light is emitted from the sample. Systems and methods are described for alignment of the CL mirror in the XY plane, which is orthogonal to the axis of the electron beam, and for alignment of the sample with respect to the focal point of the CL mirror along the Z axis, which is coincident with the electron beam.

16 Claims, 19 Drawing Sheets

Inside of Electron microscope e-beam column

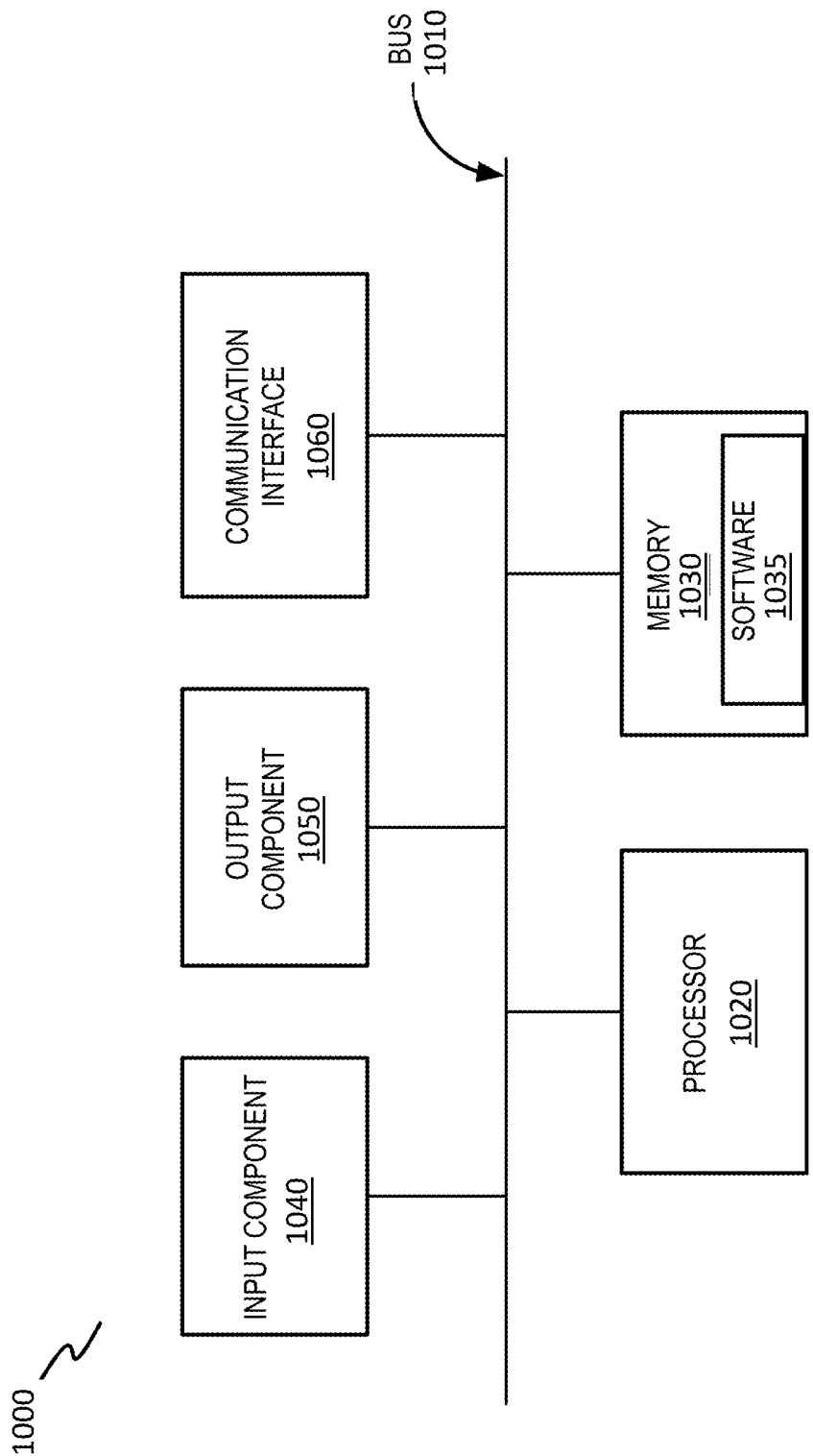

SYSTEM AND METHOD FOR ALIGNMENT OF CATHODOLUMINESCENCE OPTICS

CROSS-REFERENCE TO RELATED APPLICATION

This application claims priority under 35 U.S.C. § 119, based on U.S. Provisional Application No. 62/924,891, filed Oct. 23, 2019, the disclosure of which is hereby incorporated by reference herein.

BACKGROUND

When a high energy electron or ion beam (e-beam) strikes a sample, photons can be emitted depending on the sample material. The emitted photons are also known as cathodoluminescence (CL). The collection and detection of these photons in the wavelength range from UV through visible to IR, can provide a wealth of information about the sample under investigation. CL is typically examined with the sample in an electron microscope (EM) and collected by directing the CL to, for example a light sensor, image array, or spectroscopy equipment, any or all of which may be located outside the microscope electron beam column. One way to collect CL is via a collection mirror, often with a paraboloid or ellipsoid shape, located on axis with the e-beam and either above (more typically) or below the sample or both. Where the collection mirror is located above the sample, on axis with the e-beam, the mirror will have a hole to allow the e-beam to pass through unobstructed.

The location on the sample where the e-beam strikes, and thus the location where the CL is emitted, is ideally at the focal point of the collection mirror in three-dimensional space. Any misalignment in any axis, even as a small as 1-10 microns (μm), may cause a significant loss in the amount of CL light reflected back to the light sensor and will limit the fidelity of information about the angle of emission of the CL.

Alignment of the CL mirror with respect to the e-beam is possible. For example, the CL equipment may have alignment mechanics that allow the mirror to be moved in the XY plane (relative to and perpendicular to the e-beam axis) and these mechanics are typically used to bring the CL focal point onto the e-beam axis during an alignment procedure. The e-beam can also be moved in the XY plane by tens or even hundreds of microns for alignment purposes, but this is often less desirable because large motion from the EM objective lens optic axis can degrade the focus of the e-beam. Smaller motions, on the order of one to tens of microns, can be useful for fine tuning during alignment when the alignment mechanics are not reliable at the micron level.

It is also necessary to align the sample with respect to the CL mirror along the Z axis. The most flexible way to accomplish this is to move the sample in the Z axis with a sample stage upon which the sample rests. The CL equipment will typically have alignment mechanics that allow the mirror to be moved in the Z axis, but this is often less desirable for alignment to the sample because large motion from the CL spectrometer optic axis can degrade the coupling of the CL light pattern and intensity.

It should be noted, however, that moving the sample in the XY plane, which is often performed in experiments, can upset the Z axis alignment if the sample surface is tilted or is not uniform. Manual adjustments, naturally, are time-consuming and limit a researcher's ability, for example, to examine multiple locations on the sample and to examine the sample under multiple e-beam voltages. It is not uncommon for these manual adjustments to require several minutes to several tens of minutes, depending on the quality of the alignment being performed.

Alignment methods typically have required maximizing the intensity of CL from the sample while changing the XY or Z alignment. This method works well for samples that strongly emit CL that does not vary in time or as the e-beam moves to nearby XY positions. However, these methods often fail when attempted on the more typical samples that do have time and space variant CL properties. It is therefore desirable to work with methods of alignment that do not rely on the CL properties of the sample under investigation.

It should be noted that it is possible to create a sample that, over a limited range of e-beam conditions, does emit CL where the intensity does not change in time, does not change in XY position, but does change as a function of Z position. A sample with these properties is useful for aligning the CL mirror in XY and Z axes using the aforementioned CL intensity maximization methods. An example of such a sample is a 1-10 micron thick yttrium aluminum garnet (YAG), yttrium aluminum perovskite (YAP), or bismuth germanate (BGO) film coated onto a non-reflective conductive substrate, and coated with a conductive film such as carbon or indium tin oxide (ITO). Although useful for initial alignment of the CL mirror, the Z axis alignment is lost as soon as a new sample is examined, and the XY and Z axes alignments are lost when the e-beam accelerating voltage is changed.

BRIEF DESCRIPTION OF THE DRAWINGS

FIG. 10 is an exemplary processing system.

DETAILED DESCRIPTION OF PREFERRED EMBODIMENTS

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 1:
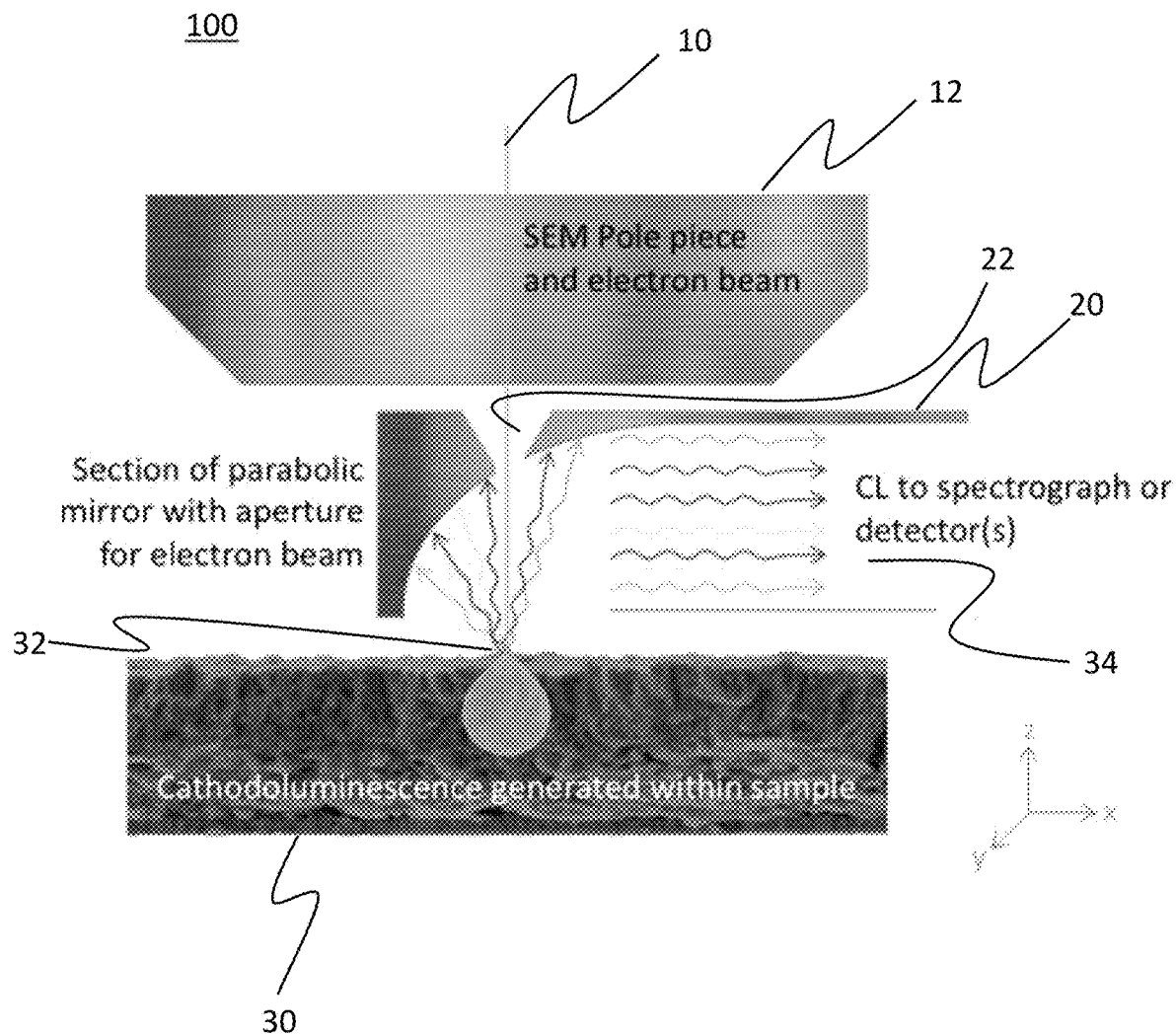
FIG. 1 is a diagram of an apparatus for collection of cathodoluminescence light (CL) emitted by a sample in an electron microscope.

In an aspect of the invention, as shown in FIG. 1, an electron microscope 100 produces an electron beam (e-beam) 10 that exits a pole piece 12 and is directed toward sample 30. At the point where the e-beam 10 strikes the sample (identified at numeral 32 in FIG. 1), cathodoluminescence (CL) light may be generated. A mirror 20, which may be a paraboloid mirror, is provided to reflect the CL light 34 to detectors, which may be located outside of the electron microscope 100. The mirror 20 may have an aperture 22 to allow the e-beam 10 to pass through, since the mirror may be made of a material (e.g. diamond polished aluminum) that would otherwise obstruct the e-beam.

Figure 2:
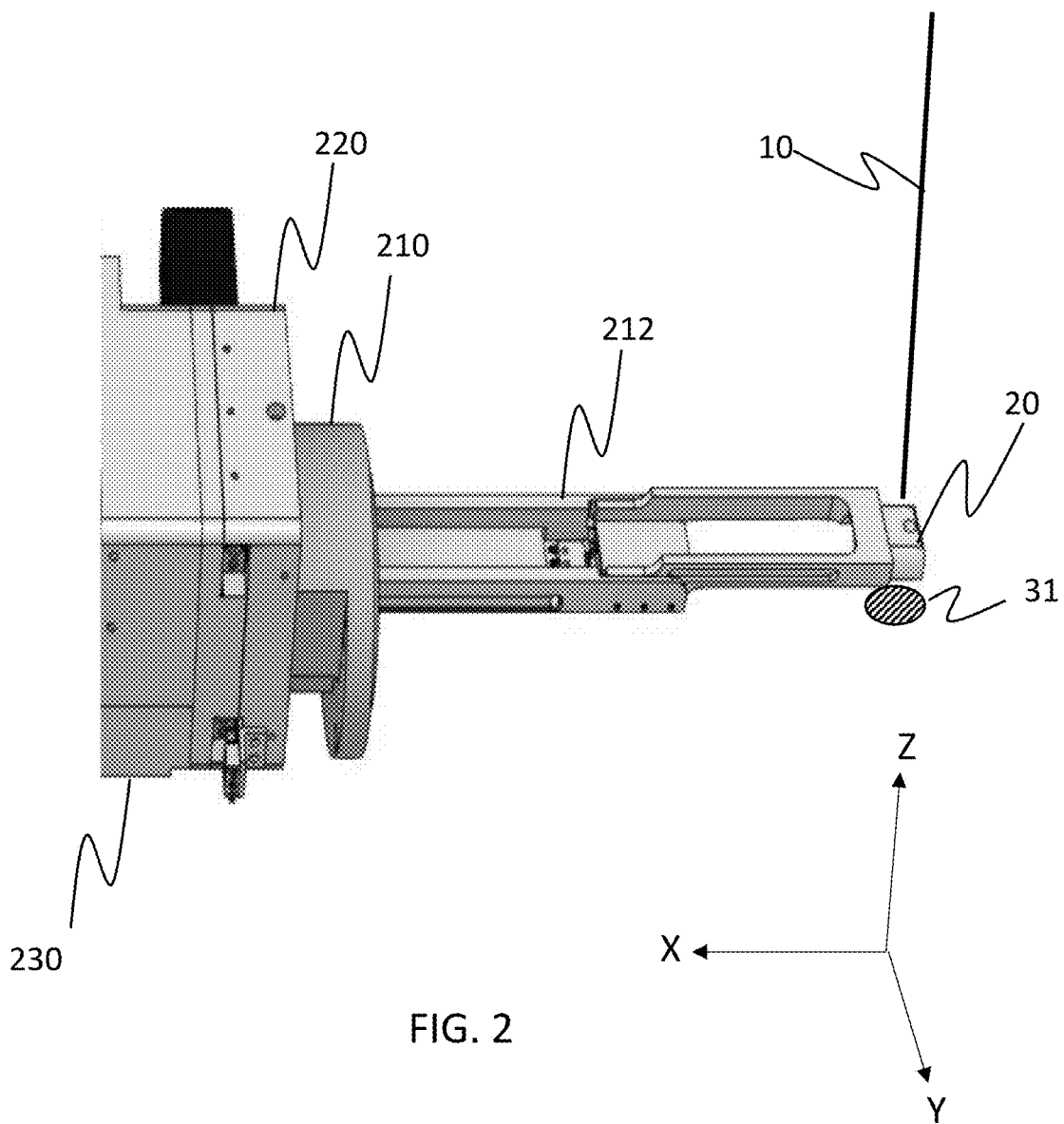
FIG. 2 is an isometric drawing of an exemplary CL mirror actuator.

In an aspect of the invention, shown in FIG. 2, the CL mirror 20 is part of a CL optical system 200 (partial view). The CL optical system 200 mounts to the electron microscope at a mounting hub 210. The CL optical system 200 includes a mirror insertion slide 212 that may be electromechanically actuated in the X axis (as labeled in the figure) to move the mirror 20 in and out of the path of the e-beam 10. The mirror insertion slide 212 may also be finely and repeatably adjusted to align the mirror 20 in the X axis with respect to e-beam 10. The sample (not shown) rests on sample stage 31 and may be raised and lowered along the Z axis by an actuator in the electron microscope. The CL system 200 may include an electron microscope interface assembly 220 that connects mounting hub 210 to the remainder of the CL system 230, which is attached internally to the mirror insertion slide 212. The electron microscope interface assembly 220 may include one or more linear actuators arranged to move the CL system 230 with respect to the hub 210. In an exemplary embodiment, the electron microscope interface assembly 220 includes two linear actuators, one that moves the CL system along the Y axis with respect to the e-beam and one that moves the CL system in the Z axis with respect to sample stage 31. As such, the CL mirror may be moved with respect to the sample and e-beam in the X, Y and Z axes, via the mirror slide 212 (X axis) and the two actuators in the electron microscope interface assembly 220. The sample may also be moved relative to the CL mirror in the Z axis by an actuator in the electron microscope.

The exemplary system 200 described above is but one way to actuate the CL mirror with respect to the e-beam and sample in the X, Y and Z axes. The exemplary actuation mechanisms described are not intended to limit any aspects of the invention.

Figure 3:
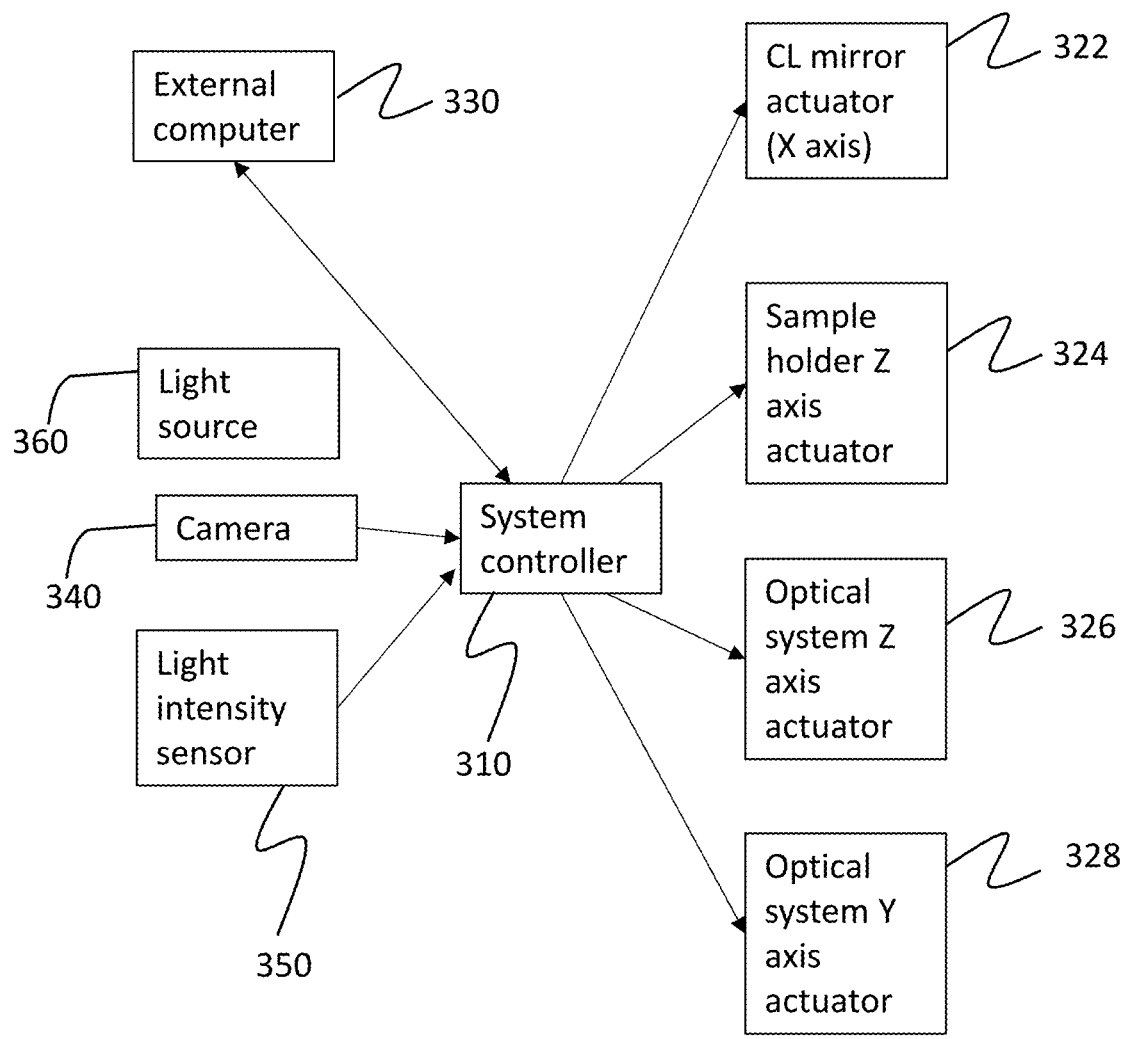
FIG. 3 is a block diagram of an exemplary CL optics system.

FIG. 3 shows an exemplary control system for controlling the actuators described above and for performing other functions consistent with the embodiments described herein. The control system includes a system controller 310. The system controller 310 may be a single processor that is part of the electron microscope, or that is part of an optical system external to the electron microscope or may comprise multiple processors in communication with each other. For example, there may be an electron microscope processor and an optical system processor. The system controller may control a CL mirror X axis actuator 322, a sample holder Z axis actuator 324, an optical system Z axis actuator 326, and an optical system Y axis actuator 328. The system controller may receive inputs from one or more cameras 340 and one or more light intensity sensors 350. The system controller 310 may control a light source 360 for illuminating a sample via a CL mirror, for example in the Z axis alignment process described below. The system controller 310 may also communicate with an external computer 330.

Figure 4A:
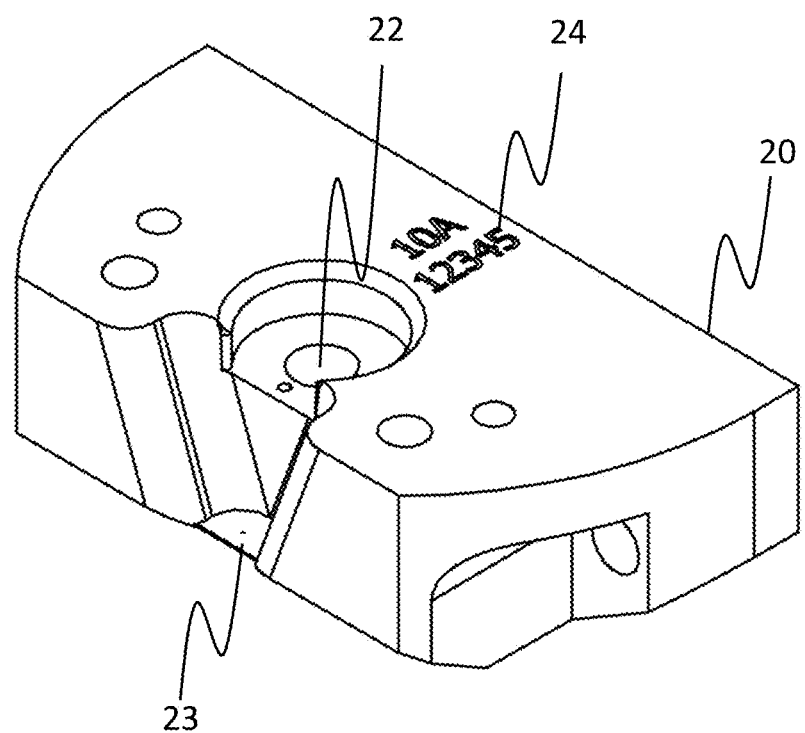
FIG. 4A is an isometric drawing of an exemplary CL mirror.
Figure 4B:
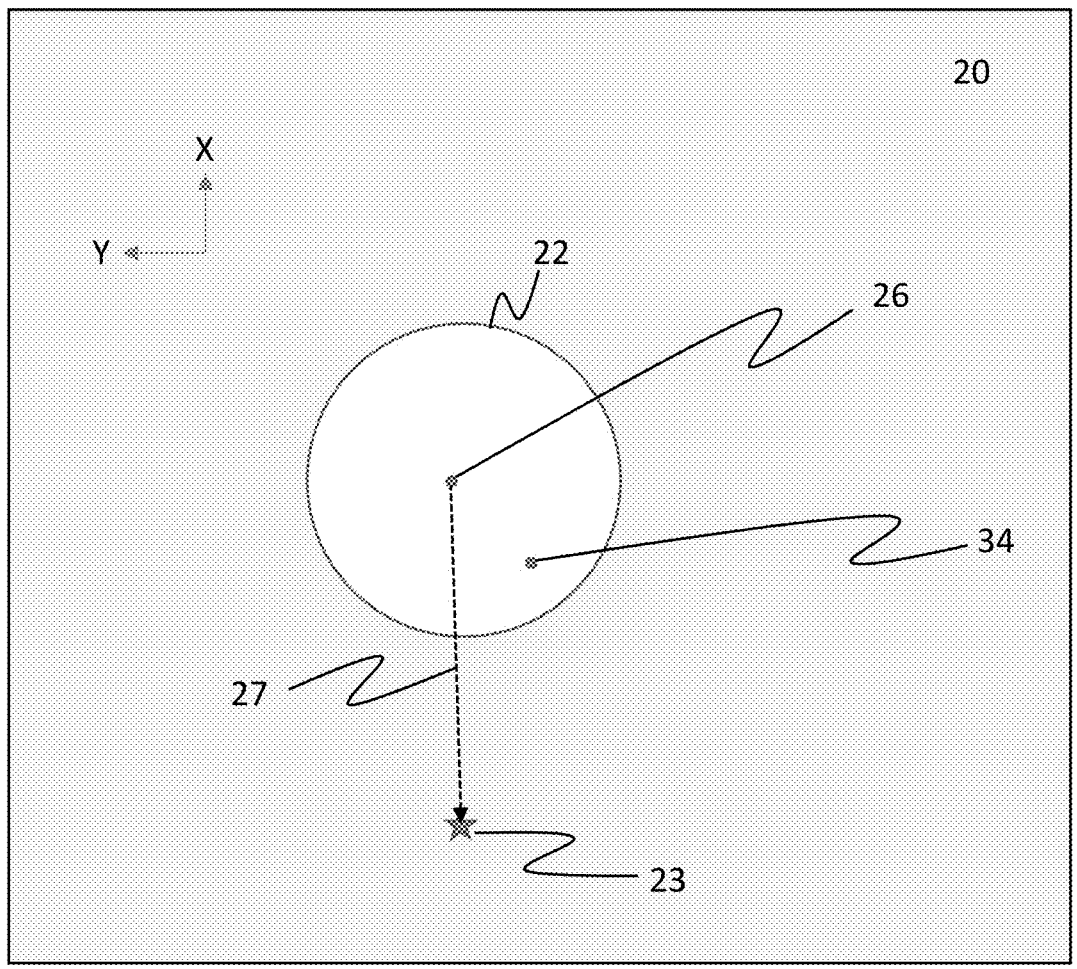
FIG. 4B is a view in the XY plane of a portion of the apparatus of FIG. 1 prior to alignment in the XY plane.
Figure 4C:
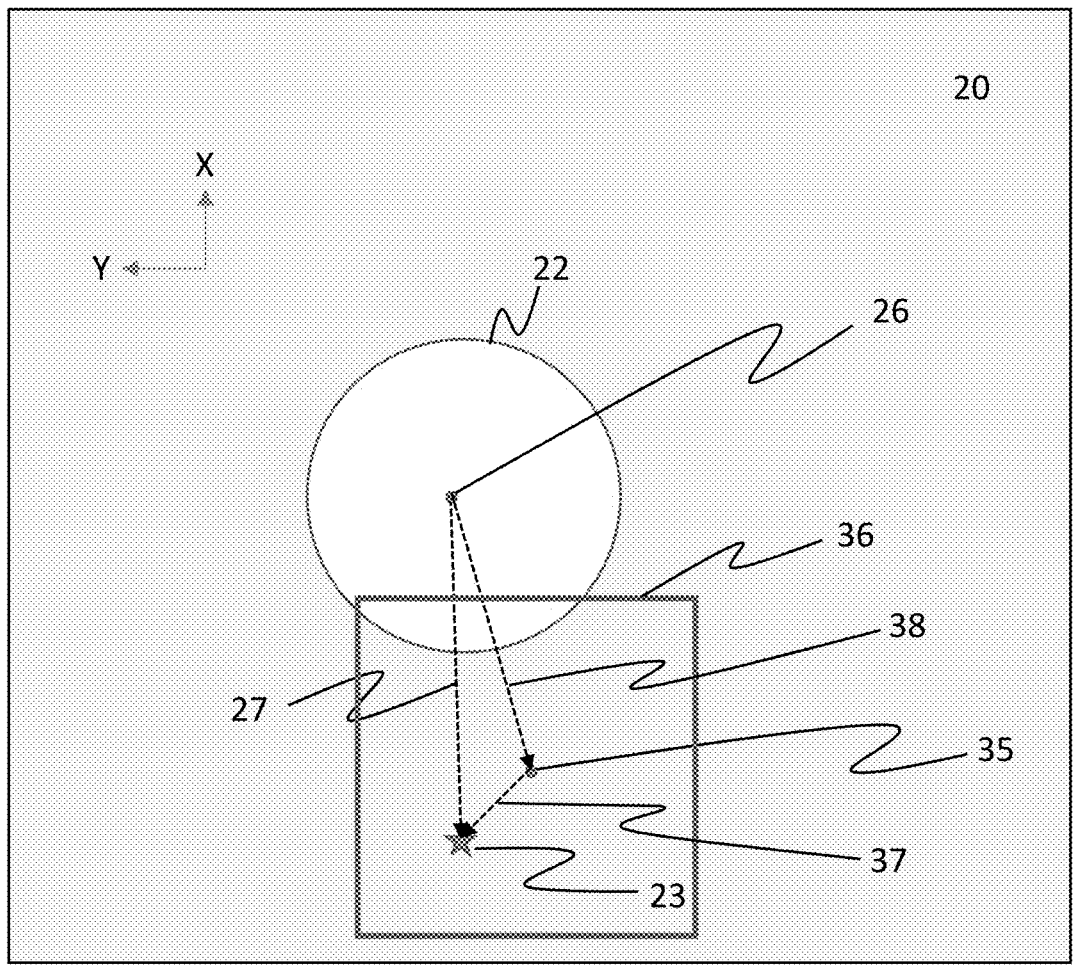
FIG. 4C is a view in the XY plane of a portion of the apparatus of FIG. 1 during alignment in the XY plane.

In a further aspect of the invention, an alignment procedure, herein referred to as "MirrorfeatureXY", for rapidly setting the e-beam 10 axis and CL mirror 20 focal point to be coincident is illustrated in FIGS. 4A, 4B, and 4C. After calibration information is obtained, the MirrorfeatureXY alignment procedure can be performed in tens of seconds making it useful for quickly tuning the system after CL mirror 20 has been inserted imprecisely into position around e-beam axis 10 or the EM accelerating voltage or apertures have been adjusted. This procedure can be performed without the use of CL, so it is particularly suitable for alignment when examining samples that do not emit CL light reliably at every position.

FIG. 4A shows an exemplary embodiment of a collection mirror 20 with aperture 22 to allow the e-beam 10 (not shown) to pass through to a sample (not shown). Mirror identification text 24 can be referenced to information about the physical and optical properties of mirror 20 and may be positioned close to aperture 22 so it may be read inside the electron microscope.

FIG. 4B shows an exemplary schematic of a portion of the top of a collection mirror 20 with aperture 22 to allow the e-beam 10 to pass through to a sample (not shown). In an aspect of the invention, one or more features 23 on the mirror 20 as shown in FIGS. 4A, 4B, and 4C can serve as a positional reference mark whose distance vector 27 from the focal point 26 of CL mirror 20 is a fixed property of the mirror 20. Distance vector 27 can be determined during the time of manufacture of the CL mirror, or subsequently using an optical or electron microscope to image one or more features 23 and measure their distance to the focal point 26 of the CL mirror 20. Locating the focal point 26 of the CL mirror 20 for this calibration procedure typically requires passing light through the mirror to find the point of best focus.

Figure 4D:
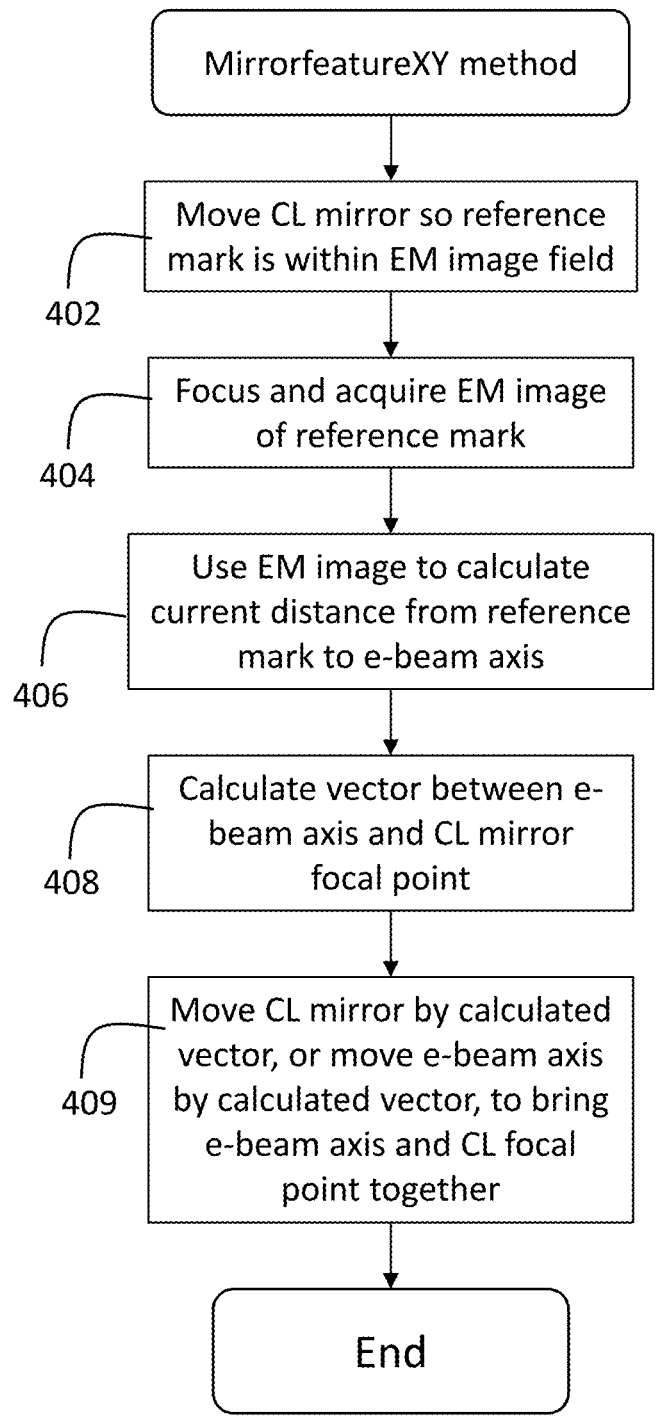
FIG. 4D is a flow chart of an exemplary process for alignment in the XY plane of the system of FIG. 1.

FIG. 4D is a flow chart of an exemplary MirrorfeatureXY procedure, to be performed with reference to FIGS. 4A, 4B, and 4C. FIG. 4B is shown prior to beginning the MirrorfeatureXY procedure, where the e-beam 10 axis is at location 34 and the thus the CL mirror 20 is not aligned to the X and Y axes of the e-beam 10. In flow chart step 402, the CL mirror 20 is moved so that a positional reference mark 23, which may be terms a region of inspection, can be imaged in the EM. FIG. 4C is shown after step 402 is complete. In step 404, the EM is focused on positional reference mark 23 and an EM image is acquired with a field-of-view 36 that is large enough to image positional reference mark 23. In step 406, the acquired image is analyzed to determine the distance vector 37 from e-beam axis 35 (typically also the center of image field-of-view 36) to the positional reference mark 23. In step 408, the distance vector 38 between the e-beam axis 35 and the CL mirror 20 focal point is calculated by subtracting distance vector 37 from distance vector 27. In step 409, the CL mirror 20 is moved by distance vector 38 to bring the mirror focal point at location 26 to be coincident with the e-beam axis 35. Alternatively, in step 409 the e-beam axis could be moved by negative distance vector 38 to bring the e-beam axis 35 to be coincident with the mirror focal point at location 26. Moving the e-beam axis is typically less desirable than moving the mirror position because EM image resolution will be compromised when moving the e-beam axis away from the EM objective lens center.

In a further aspect of the invention, an alignment procedure, herein referred to as "MirrorfeatureZ", for rapidly setting the sample portion under observation to the correct height for CL is illustrated in FIGS. 4A, 4E, 4F, 4G, and 4H. After calibration information is obtained, the MirrorfeatureZ alignment procedure can be performed in tens of seconds making it useful for quickly moving between many different sample portions in a CL experiment. This procedure can be performed without the use of CL, so it is particularly suitable for alignment of samples that do not emit CL light reliably at every position.

Figure 4E:
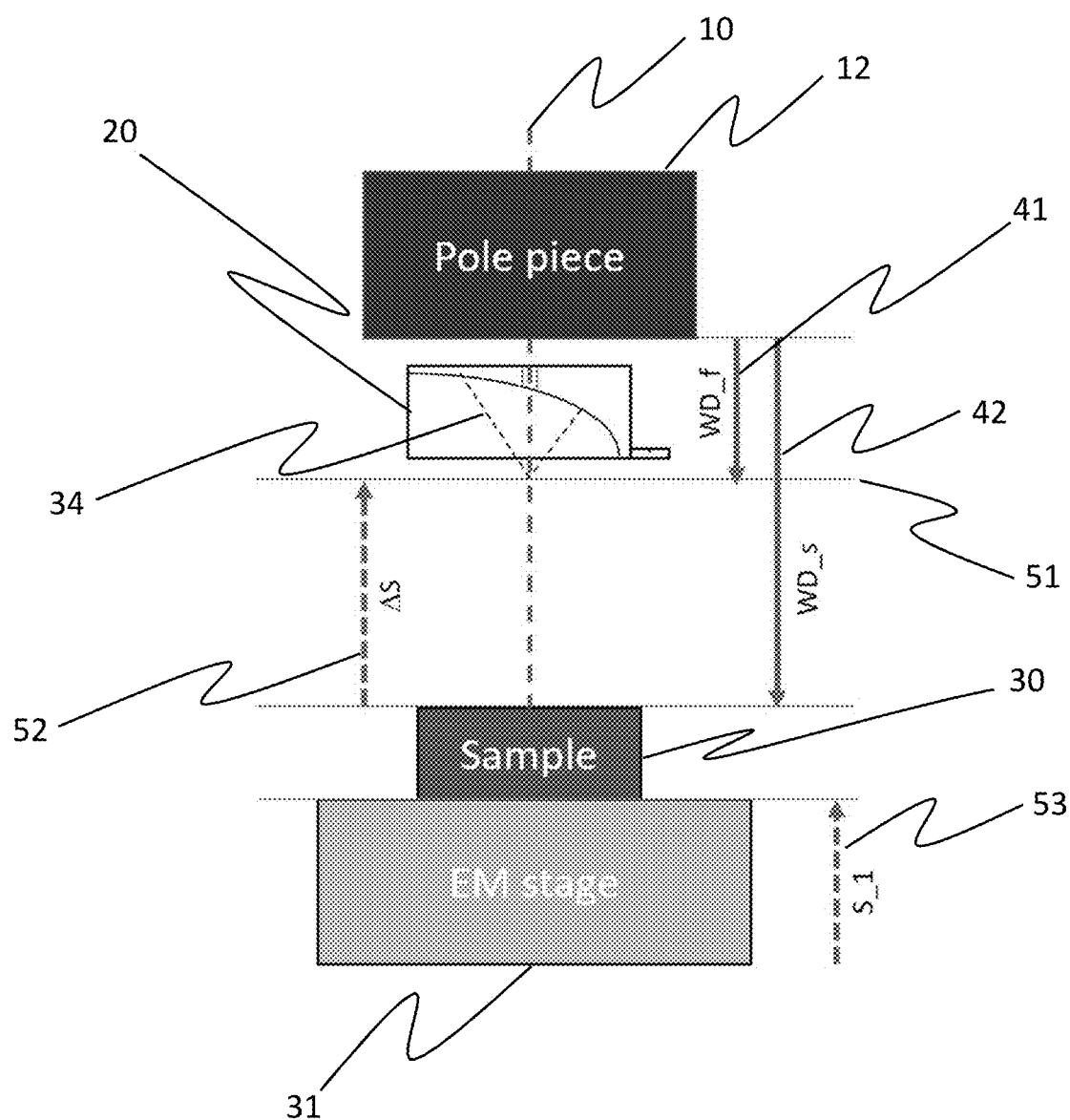
FIG. 4E is a schematic diagram in the vertical plane of a portion of the system of FIG. 1 prior to alignment in the Z axis.

FIG. 4E shows the surface of sample 30 in a position far from the horizontal plane 51 that contains the focal point of CL mirror 20. A flowchart of an exemplary MirrorfeatureZ method is outlined in FIG. 4H. At the start of the alignment procedure 410, the EM is focused on the surface of sample 30, and in step 420 the working distance (WD_s) 42 of the surface of sample 30 is calculated. In step 430, the position 53 of the sample stage 31 is recorded.

Figure 4F:
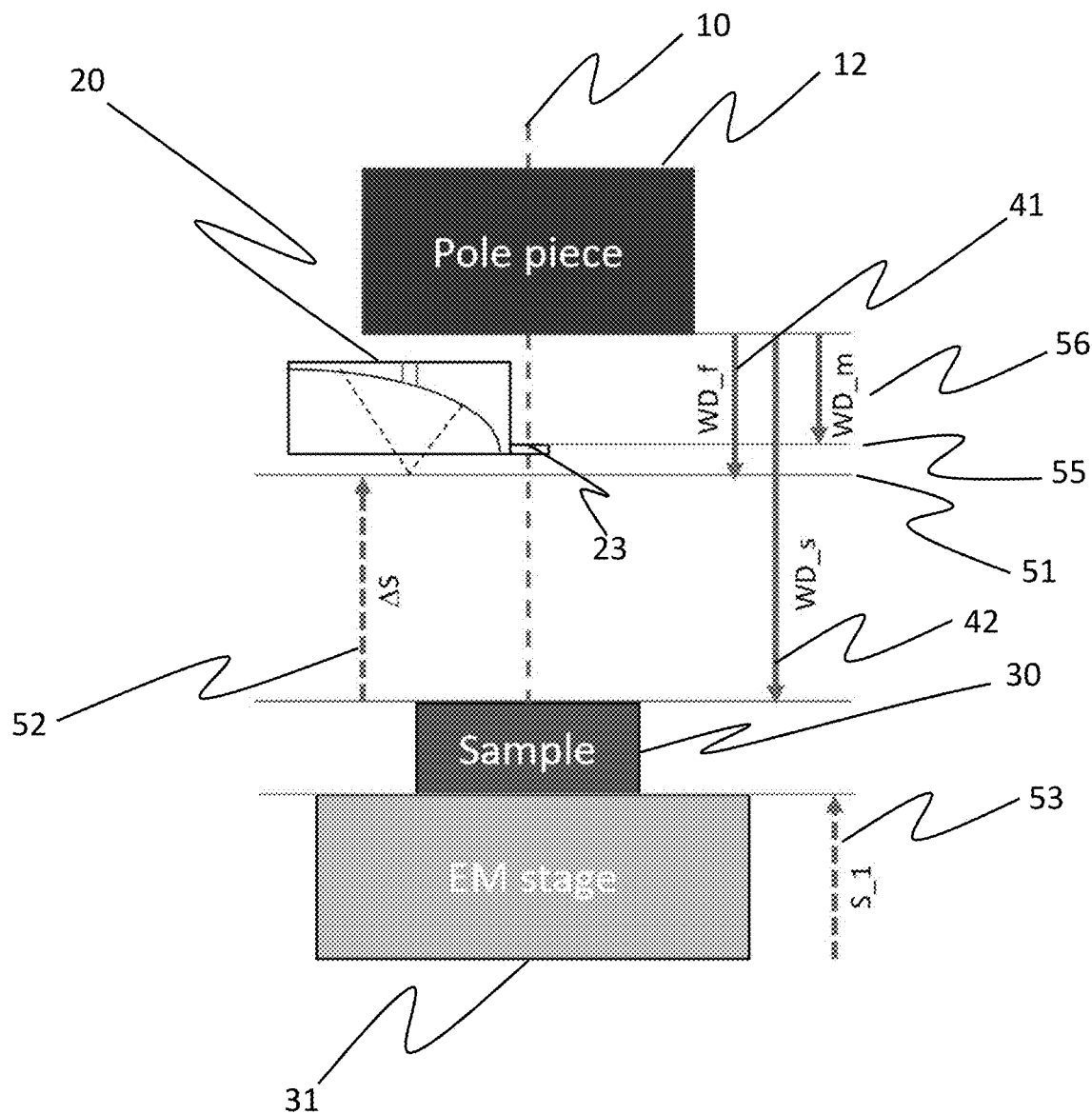
FIG. 4F is a schematic diagram in the vertical plane of a portion of the system of FIG. 1 during alignment in the Z axis.

In step 432 and FIG. 4F, the CL mirror 20 is moved so that a positional reference mark 23 can be imaged in the EM. In step 434, the EM is focused on positional reference mark 23 (located on horizontal plane 55) and in step 436 the working distance 56 of the positional reference mark 23 is calculated.

Figure 4G:
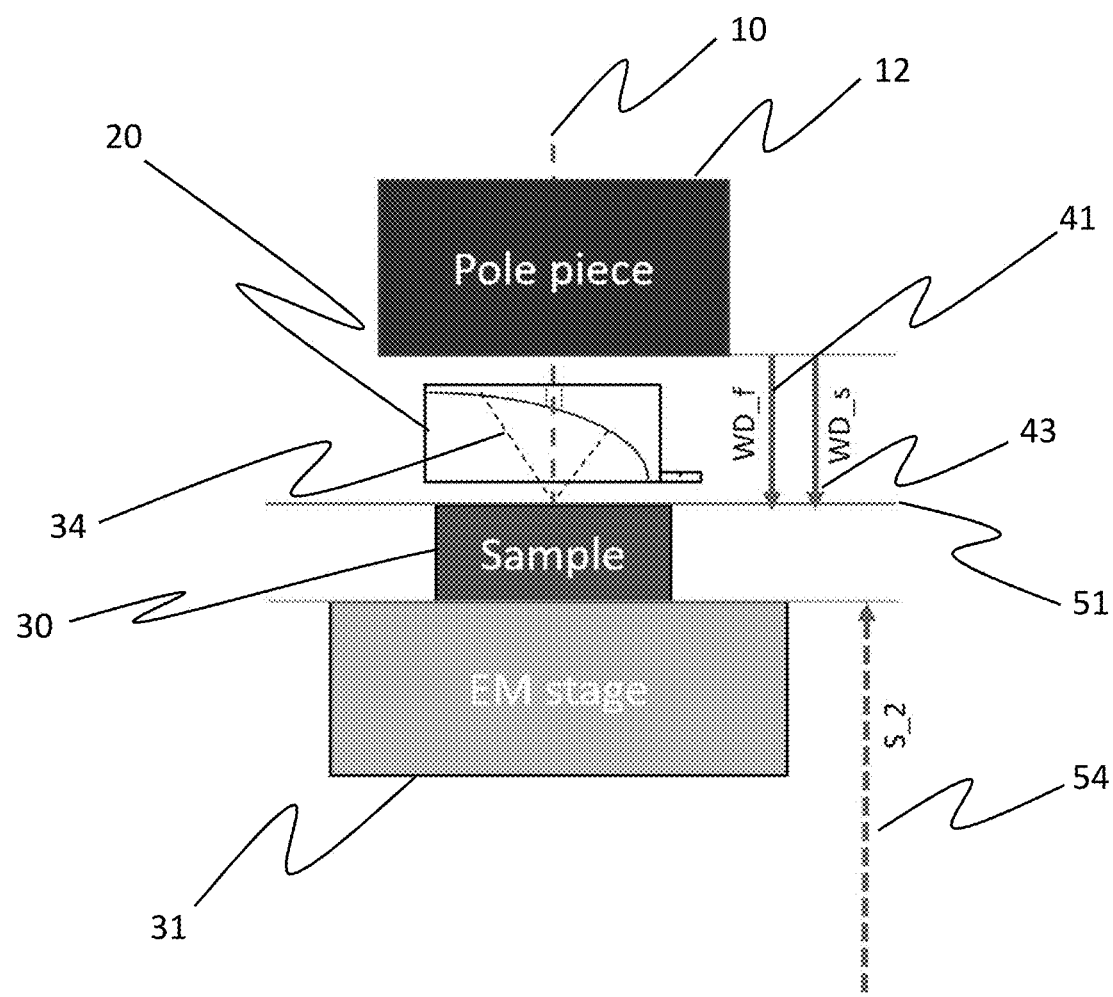
FIG. 4G is a schematic in the vertical plane of a portion of the system of FIG. 1 after alignment in the Z axis.
Figure 4H:
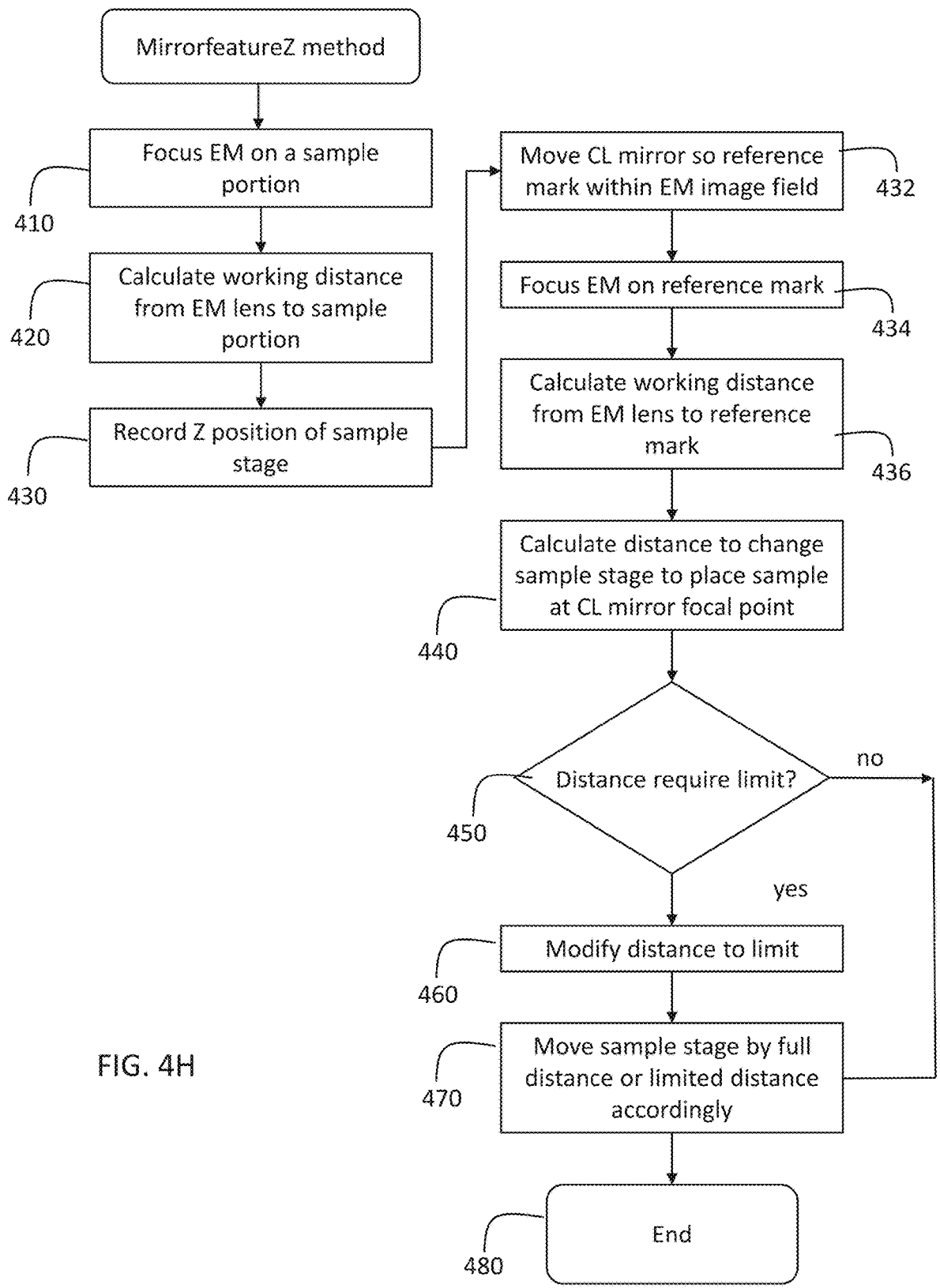
FIG. 4H is a flowchart of an exemplary process for alignment of the system of FIG. 1 in the Z axis.

In step 440, the distance ΔS 52 in which to adjust sample stage 31 is calculated. This requires previously measured calibration information which may be stored as the distance between horizontal plane 51 that contains the focal point of CL mirror 20 and horizontal plane 55 which contains the positional reference mark 23. In step 450, information about the sample stage 31 extents, sample 30 extents, and the mirror 20 position may be used to determine if there may be a collision of the sample stage 31 or sample 30 and the mirror 20 if the sample stage 31 is raised by the full distance 52. This information may be manually entered or previously measured by the system. If so, at step 460, a safe portion of distance 52 that can be moved is calculated. In step 470, the sample stage is moved by all or a portion of distance 52. Note that steps 450 and 460 are optional and as such step 440 could proceed directly to step 470. FIG. 4G shows the position of the sample 30 and sample stage 31 after the MirrorfeatureZ method has been performed and distance 52 was not limited. Sample stage 31 is at position 54 where the surface of sample 30 has been moved to horizontal plane 51 that contains the focal point of CL mirror 20. After MirrorfeatureZ, it is convenient to automatically set the focus of the EM to working distance 43 which is identical to the working distance WD_f 41 of the focal point of CL mirror 20 and the surface of sample 30. The process ends at 480. Note that if in step 470 the sample stage travel is limited then the quality of the final alignment is compromised.

Machined feature 23 is an exemplary positional reference mark, and in this embodiment shown in FIG. 4A it is located as close as practical to the bottom face of mirror 20 so that the focus setting of electron microscope 100 changes minimally between imaging the sample and the machined feature 23. There are other features on mirror 20 that can be used as a positional reference mark, including, but not limited to, aperture 22, mirror identification text 24, and surface imperfections or grain structure on a horizontal surface of mirror 20. Note that the positional reference mark does not need to be directly on CL mirror 20 but can be on an assembly that is rigidly attached to CL mirror 20.

In a further aspect of the invention, an alignment procedure, herein referred to as "LaserfocusZ", for rapidly setting the sample portion under observation to the correct height for CL is illustrated in FIGS. 5A, 5B, 6, and 7.

Figure 5A:
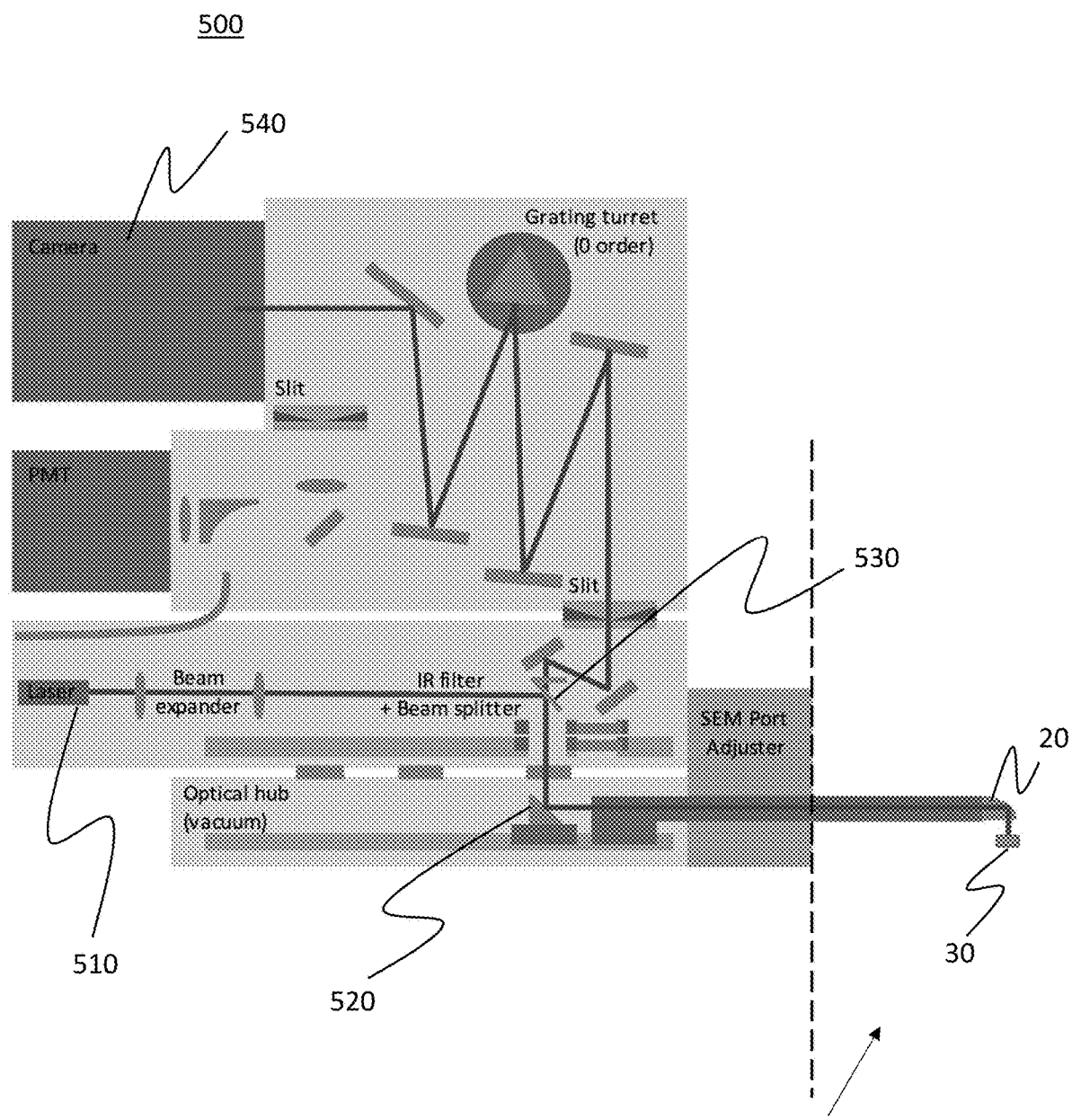
FIG. 5A is a schematic drawing of an exemplary CL optics system.
Figure 5B:
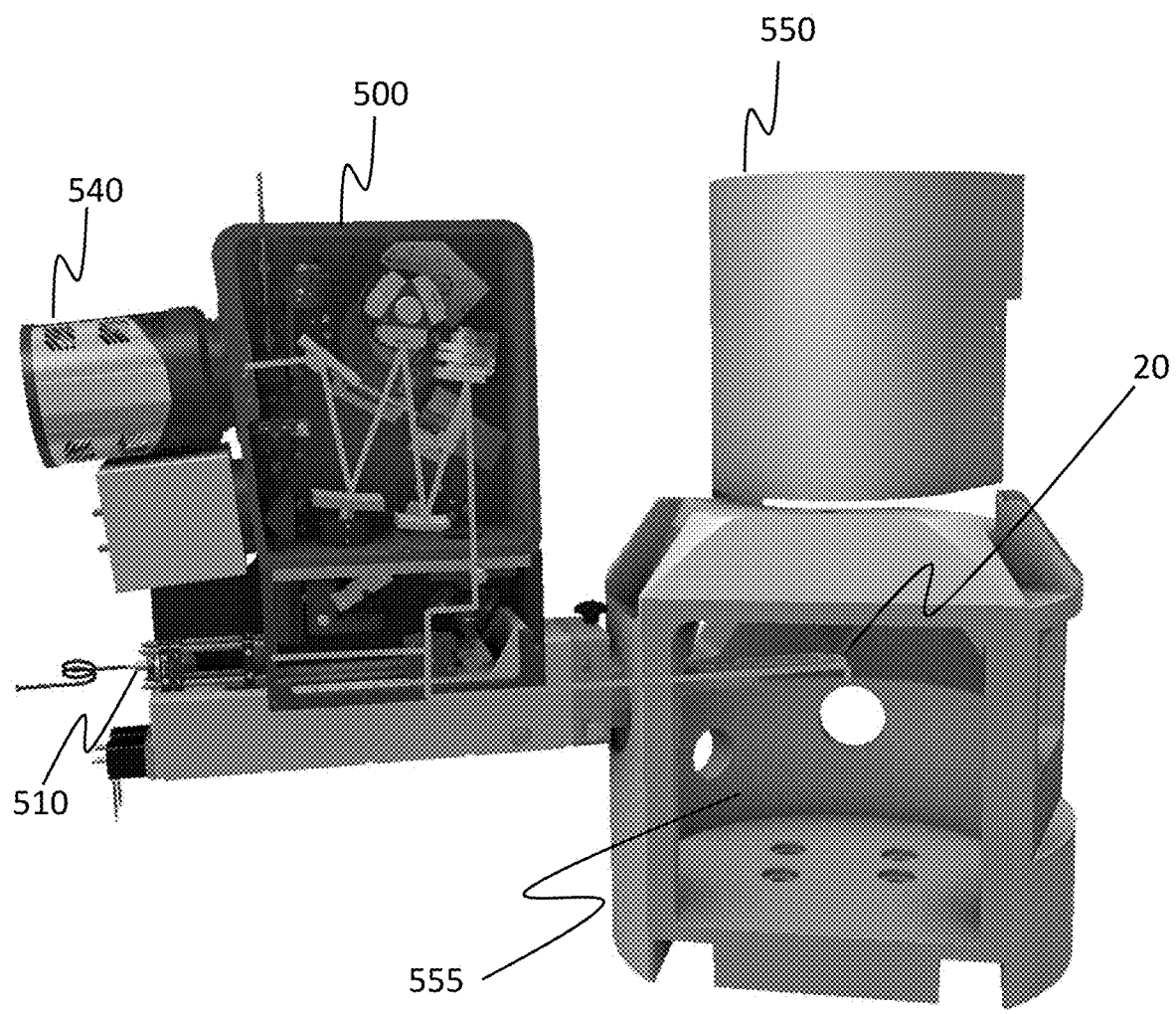
FIG. 5B is an isometric cut-away drawing of an exemplary CL optics system mounted on an electron microscope chamber.

FIGS. 5A and 5B show an optical system 500 for analysis of CL light. In the mode depicted, the system is arranged to use a light source 510, which may be a laser, to illuminate the sample 30 from outside of the electron microscope via the CL mirror 20. A portion of the laser light is reflected by the sample. FIG. 5B shows a portion of the electron microscope 550, including a sample chamber 555. In this example, the light path between the laser 510 and the CL mirror 20 includes a fold mirror 520. A beam splitter 530 returns a portion of the returned light reflected from the sample to an optical subsystem, which includes a two-dimensional camera 540. The image received at the camera 540 from returned light from the sample 20 may be analyzed to determine whether the sample is at the focal point of the CL mirror with respect to the Z axis.

Figure 6A:
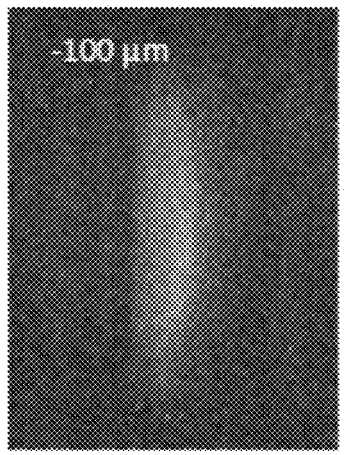
FIGS. 6A-6G are exemplary images of returned light from a sample exposed to a light source via a CL mirror that is moved to different positions along the Z axis.
Figure 6B:
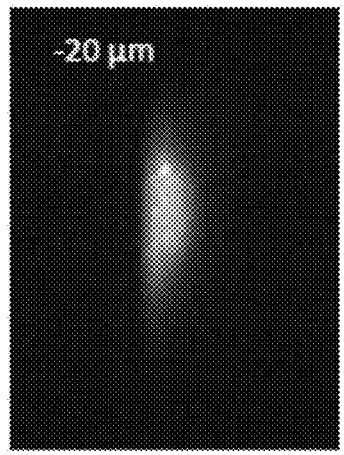
Figure 6C:
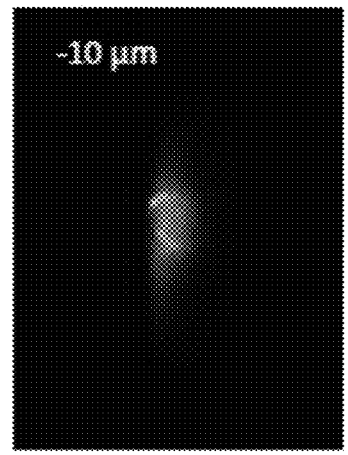
Figure 6D:
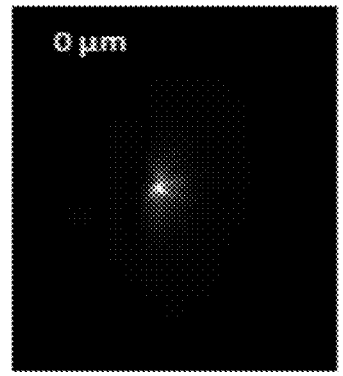
Figure 6E:
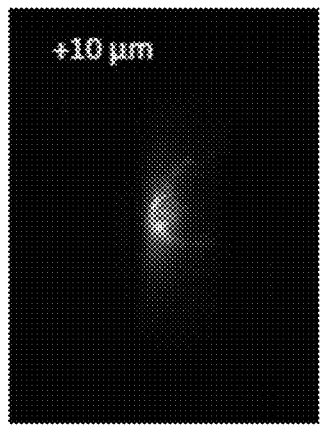
Figure 6F:
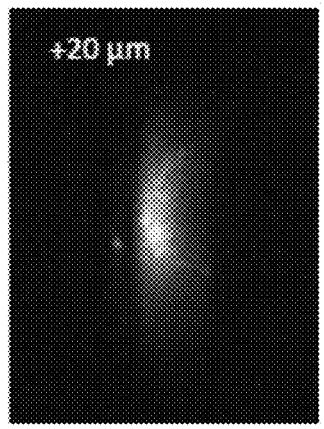
Figure 6G:
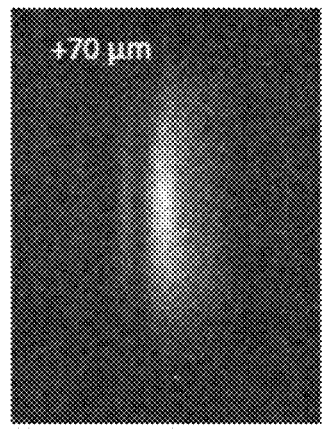

FIGS. 6A-6G are exemplary images of returned light from a sample exposed to a light source via CL mirror as just described above. FIG. 6A shows the returned light with the sample 100 μm below the CL mirror focal point. FIG. 6B shows the returned light with the sample 20 μm below the CL mirror focal point. FIG. 6C shows the returned light with the sample 10 μm below the CL mirror focal point. FIG. 6D shows the returned light with the sample at the CL mirror focal point. FIG. 6E shows the returned light with the sample 10 μm above the CL mirror focal point. FIG. 6F shows the returned light with the sample 20 μm above the CL mirror focal point. FIG. 6G shows the returned light with the sample 70 μm above the CL mirror focal point. As can be seen in these exemplary images, the returned light is focused to a small spot on the sample only when the sample is precisely located at the CL mirror focal point. Even minor offsets of <10 μm result in blurred images of the returned light spot. Intensity of the light patterns is highest when the sample is at the CL mirror focal point, and the intensity of the light patterns continually decreases as the sample is moved away from the CL mirror focal point. Consequently, either the shape of the light pattern or the intensity of the light pattern can be used as a metric for alignment in the Z direction. As a further consequence, the intensity of the light pattern can be analyzed by either a camera or by a single-channel light detector.

Figure 7:
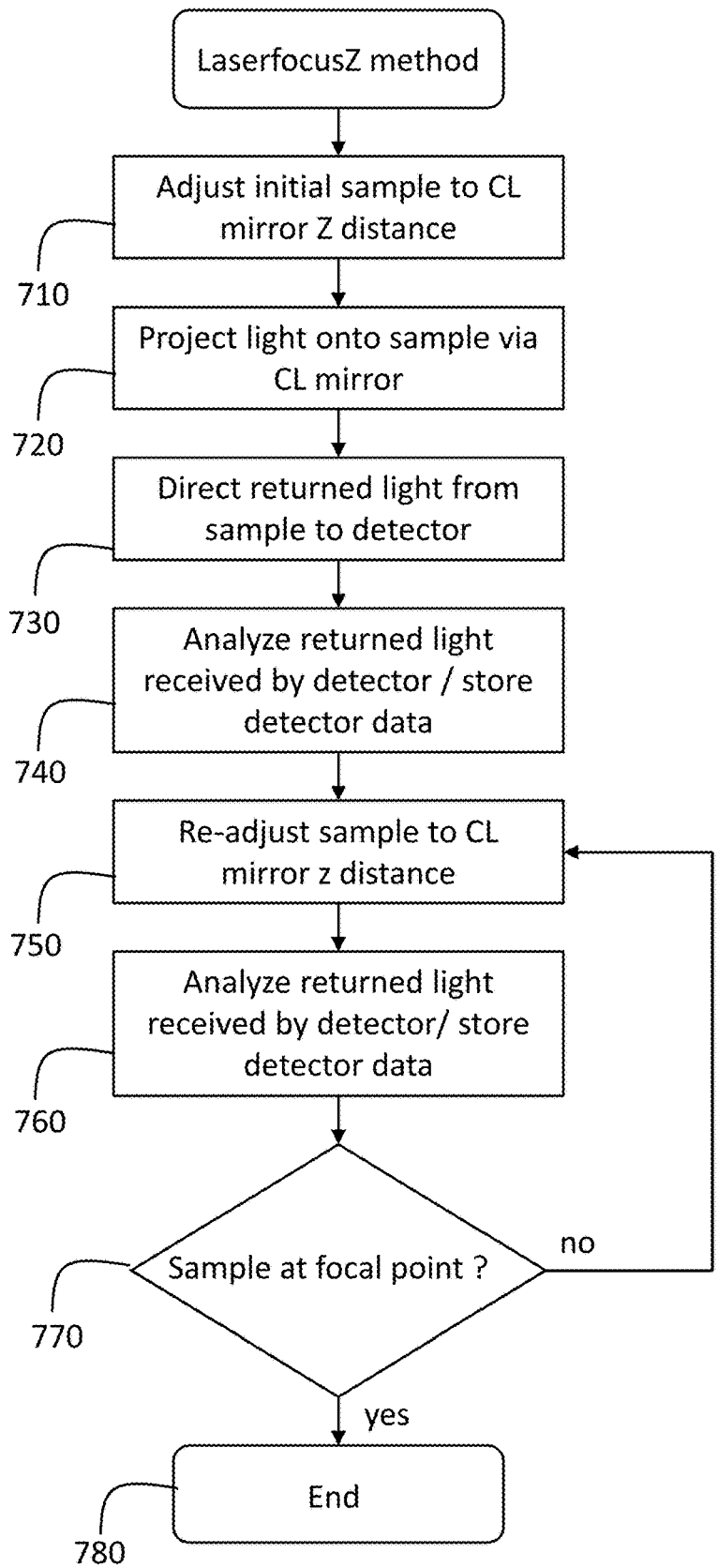
FIG. 7 is a flow diagram of an exemplary process for automated alignment of a sample with respect to a CL mirror along the Z axis.

In an aspect of the invention described now with reference to FIGS. 5A, 5B, 6A-6G, and flow diagram FIG. 7, at step 710, CL mirror 20 is moved to an initial location relative to the sample with respect to the Z axis. At step 720, light is projected onto the sample via CL mirror 20. At step 730 light reflected by the sample is directed to a detector 540. At step 740, light received by the detector is analyzed and information about the light received by the detector may be stored. At step 750, either the sample stage or the CL mirror is re-adjusted along the Z axis to change distance between the sample 30 and the CL mirror 20. In most embodiments, movement of the sample stage will be preferred as motion of the CL mirror 20 may affect the alignment of subsequent optics in the optical subsystem. At step 760, light received by the detector is analyzed and information about the light received by the detector may be stored. At decision point 770, a determination is made, based on the previously analyzed/stored detector data whether the sample is at the CL mirror focal point in the Z axis. If not, the process returns to step 750 whereupon the CL mirror is again moved. If the sample is determined to be at the CL mirror focal point, then the process ends at step 780. Alignment of the sample with respect to mirror 20 in the Z axis can be performed without the use of CL, so it is particularly suitable for alignment where samples may not emit CL light reliably at every position.

In an aspect of the invention, the sample holder movement or the CL mirror movement may be performed under continuous closed loop control or in a stepped manner as described in FIG. 7. In a further aspect of the invention, either the CL mirror 20 or the sample 30 are moved as just described, but only in a limited number of steps. In this aspect, 2D images or light intensity measurements are taken at each step and analyzed to predict where the correct focal point is located, without having to slew the CL mirror 20 or the sample 30 in a continuous motion to align the sample with respect to the CL mirror focal point. The analysis may be based on a comparison of previously obtained images of in and out of focus samples or may be based on a curve fit of data extracted from the images, for example of an integral of the total amount of light in each image.

Figure 8A:
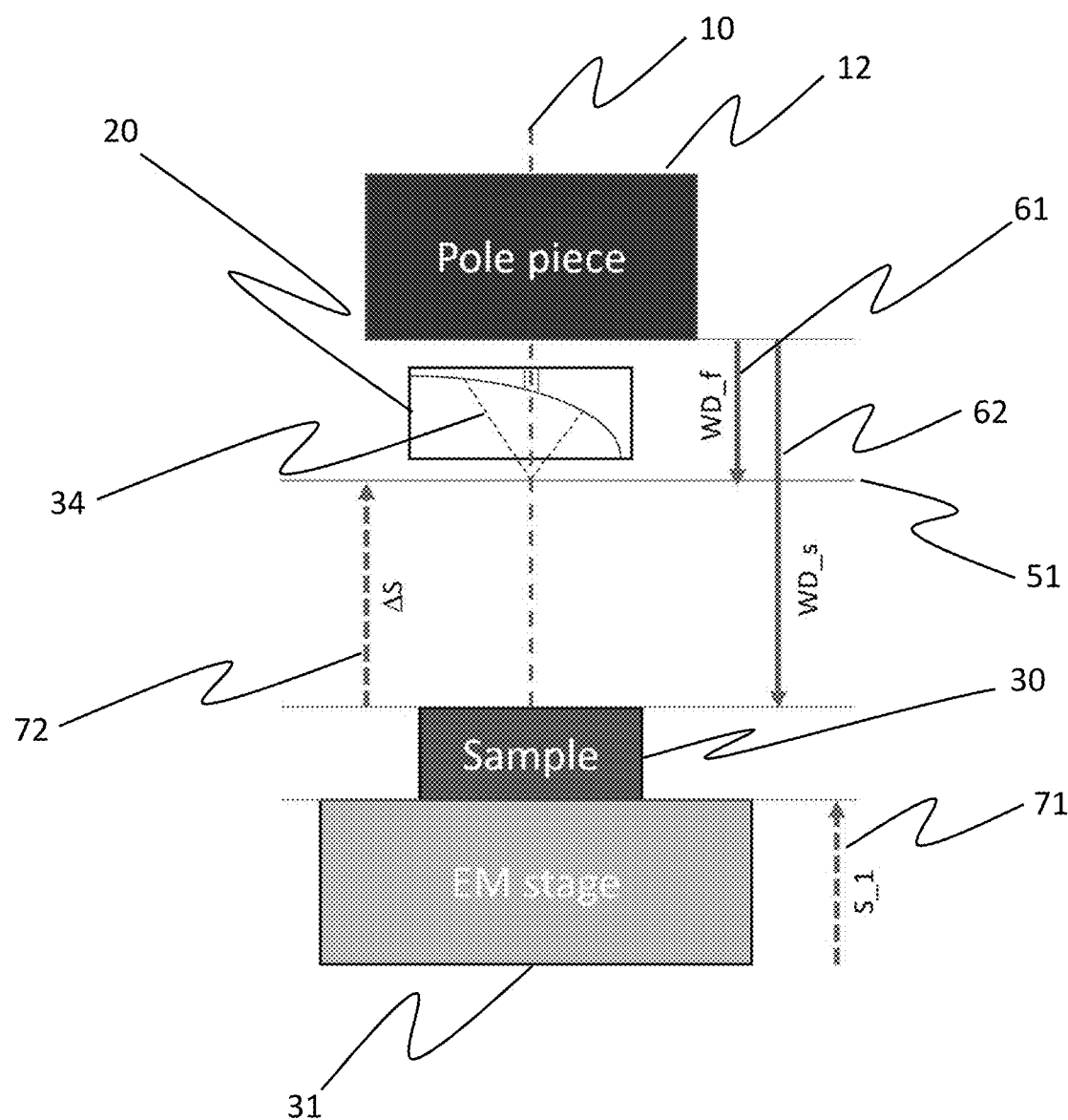
FIG. 8A is a schematic diagram in the vertical plane of a portion of the system of FIG. 1 prior to alignment along the Z axis.
Figure 8B:
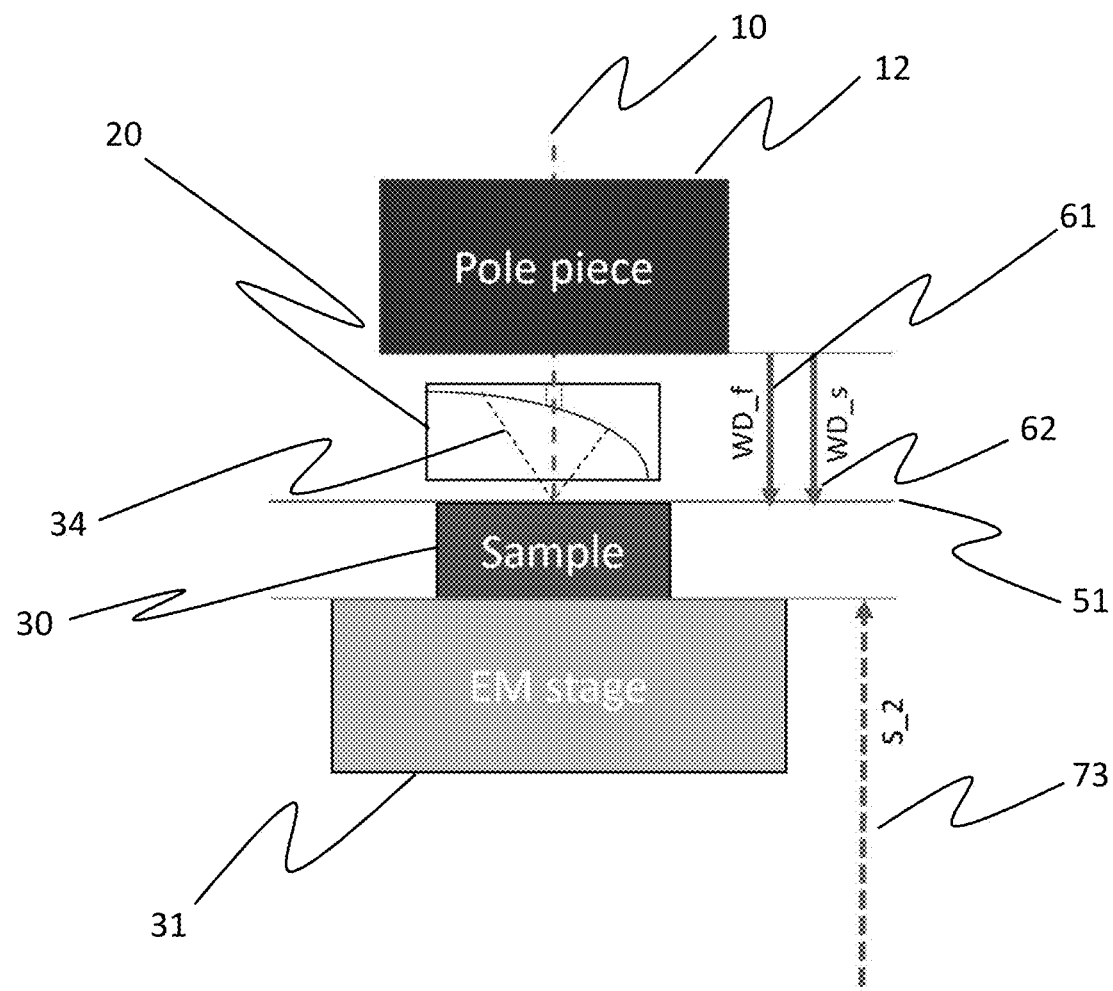
FIG. 8B is a schematic diagram in the vertical plane of a portion of the system of FIG. 1 after alignment along the Z axis.
Figure 9:
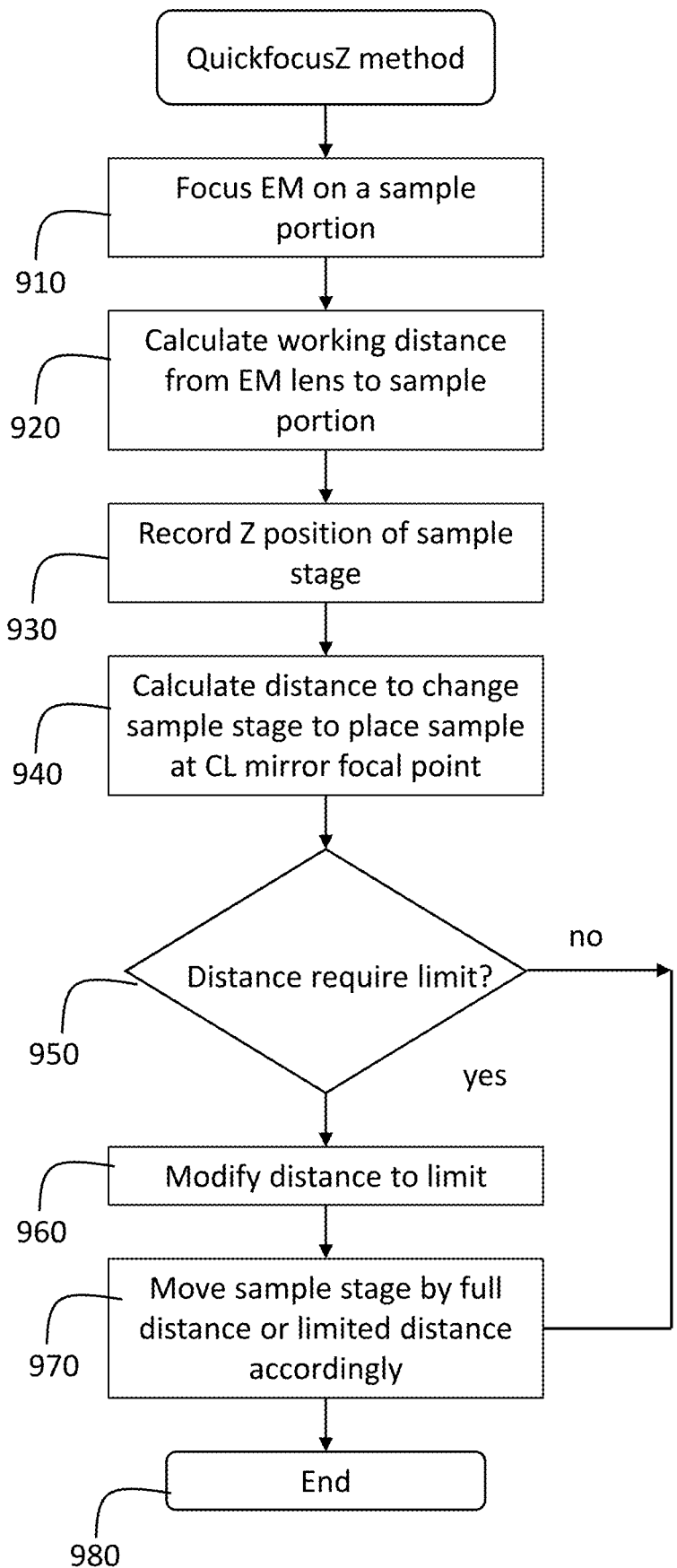
FIG. 9 is a flow diagram of an exemplary process for automated alignment of a sample with respect to a CL mirror along the Z axis.

In a further aspect of the invention, an alignment procedure, herein referred to as "QuickfocusZ", for rapidly setting the sample portion under observation to the correct height for CL is illustrated in FIGS. 8A, 8B, and 9. After calibration information is obtained as described herein, the QuickfocusZ alignment procedure can be performed in a few seconds making it useful for quickly moving between many different sample portions in a CL experiment. This procedure can be performed without the use of CL, so it is particularly suitable for alignment of samples that do not emit CL light reliably at every position.

FIG. 8A shows the surface of sample 30 in a position far from the horizontal plane 51 that contains the focal point of CL mirror 20. A flowchart of an exemplary QuickfocusZ method is outlined in FIG. 9. At the start of the alignment procedure 910, the EM is focused on the surface of sample 30, and in step 920 the working distance WD_s 62 of the surface of sample 30 is calculated. In step 930, the position S_1 71 of the sample stage 31 is recorded. In step 940, the distance ΔS 72 in which to adjust sample stage 31 is calculated. This requires previously measured calibration information which may be stored as the working distance WD_f 61 of the horizontal plane 51 that contains the focal point of CL mirror 20. In step 950, information about the sample stage 31 extents, sample 30 extents, and the mirror 20 position can be used to determine if there may be a collision of the sample stage 31 or sample 30 and the mirror 20 if the sample stage 31 is raised by the full distance ΔS 72. This information can have been previously manually entered or measured by the system. If there is a risk of collision, at step 960 the system calculates a safe portion of distance 72 that can be moved. In step 970, the sample stage is moved by all or a portion of distance 72. Steps 950 and 960 are optional and as such step 940 could proceed directly to step 970. FIG. 8B shows the position of the sample 30 and sample stage 31 after the QuickfocusZ method has been performed in a case where distance 72 was not limited. Sample stage 31 is at position 73 where the surface of sample 30 has been moved to horizontal plane 51 that contains the focal point of CL mirror 20. After QuickfocusZ it is convenient to automatically set the focus of the EM to working distance 62 which is identical to the working distance WD_f 61 of the focal point of CL mirror 20 and the surface of sample 30. Note that if in step 970 the sample stage travel is limited then the quality of the final alignment is compromised.

Although each of the alignment methods described can be used alone, combining these methods allows the CL system to be aligned quickly and precisely. In an embodiment, the MirrorfeatureXY alignment method takes 10-20 seconds and can be performed whenever EM accelerating voltage or aperture alignment is changed. One of the herein described alignment methods in the Z axis can also be performed after a MirrorfeatureXY alignment, but also after the sample position has been changed by more than a few microns. Selecting the best alignment method in Z depends on experiment accuracy requirements and the EM type. The LaserfocusZ method provides the most precise focus in Z, but the sample stage must be moved many times, typically between 5 and 30 times with each move taking between 0.5 and 3 seconds to complete. The QuickfocusZ technique is very rapid, taking only a few seconds, but its focusing accuracy may not be sufficient for some very precise experiments. The MirrorfeatureZ can be substituted for QuickfocusZ with the benefit of better accuracy when EM conditions are changed, but the time to execute MirrorfeatureZ is several times that of QuickfocusZ.

FIG. 10 is a diagram illustrating exemplary physical components of a device 1000. Device 1000 may correspond to various devices within the above-described system, such as system controller 310. Device 1000 may include a bus 1010, a processor 1020, a memory 1030, an input component 1040, an output component 1050, and a communication interface 1060.

Bus 1010 may include a path that permits communication among the components of device 1000. Processor 1020 may include a processor, a microprocessor, or processing logic that may interpret and execute instructions. Memory 1030 may include any type of dynamic storage device that may store information and instructions, for execution by processor 1020, and/or any type of non-volatile storage device that may store information for use by processor 1020.

Software 1035 includes an application or a program that provides a function and/or a process. Software 1035 is also intended to include firmware, middleware, microcode, hardware description language (HDL), and/or other form of instruction. By way of example, with respect to the network elements that include logic to provide proof of work authentication, these network elements may be implemented to include software 1035. Additionally, for example, device 1100 may include software 1035 to perform processes as described above with respect to FIGS. 4c, 4G, 7 and 9.

Input component 1040 may include a mechanism that permits a user to input information to device 1000, such as a keyboard, a keypad, a button, a switch, etc. Output component 1050 may include a mechanism that outputs information to the user, such as a display, a speaker, one or more light emitting diodes (LEDs), etc.

Communication interface 1060 may include a transceiver that enables device 1000 to communicate with other devices and/or systems via wireless communications, wired communications, or a combination of wireless and wired communications. For example, communication interface 1060 may include mechanisms for communicating with another device or system via a network. Communication interface 1060 may include an antenna assembly for transmission and/or reception of RF signals. In one implementation, for example, communication interface 1060 may communicate with a network and/or devices connected to a network. Alternatively or additionally, communication interface 1060 may be a logical component that includes input and output ports, input and output systems, and/or other input and output components that facilitate the transmission of data to other devices.

Device 1000 may perform certain operations in response to processor 1020 executing software instructions (e.g., software 1035) contained in a computer-readable medium, such as memory 1030. A computer-readable medium may be defined as a non-transitory memory device. A non-transitory memory device may include memory space within a single physical memory device or spread across multiple physical memory devices. The software instructions may be read into memory 1030 from another computer-readable medium or from another device. The software instructions contained in memory 1030 may cause processor 1020 to perform processes described herein. Alternatively, hardwired circuitry may be used in place of or in combination with software instructions to implement processes described herein. Thus, implementations described herein are not limited to any specific combination of hardware circuitry and software.

Device 1000 may include fewer components, additional components, different components, and/or differently arranged components than those illustrated in FIG. 11. As an example, in some implementations, a display may not be included in device 1000. In these situations, device 1000 may be a "headless" device that does not include input component 1040. Additionally, or alternatively, one or more components of device 1000 may perform one or more tasks described as being performed by one or more other components of device 1000.

Although the invention has been described in detail above, it is expressly understood that it will be apparent to persons skilled in the relevant art that the invention may be modified without departing from the spirit of the invention. Various changes of form, design, or arrangement, including order of performance of process steps may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A method for automated vertical alignment of a first sample portion with respect to the focal point of a cathodoluminescence (CL) mirror in an electron microscope (EM) system having a vertical axis coincident with an electron beam generated in the electron microscope system, comprising:
    focusing the EM on a sample portion;
    calculating a working distance from a feature in the EM objective lens assembly to said first sample portion based on EM objective lens current and electron accelerating voltage;
    recording the vertical position of the sample stage;
    calculating a distance to change said vertical position of the sample stage to bring the first sample portion to the focal point of the CL mirror based on said working distance and a previously determined relationship between the coordinate system of the EM and the CL mirror focal point; and
    changing the vertical position of the stage system by a portion or all of said calculated distance.

2. The method of claim 1 further comprising:
    limiting said change in vertical position of the stage system based on a physical attribute of the CL mirror or height of the sample.

3. The method of claim 1 where said previously determined relationship between the coordinate system of the EM and said CL mirror focal point is obtained by:
    adjusting the sample stage or CL mirror to place a calibration sample portion at said CL mirror focal point to optimize CL focus;
    recording a first sample stage calibration vertical position;
    focusing the calibration sample portion with the EM;
    calculating a calibration working distance from a feature in the EM objective lens assembly to said calibration sample portion using at least the EM conditions of objective lens current and electron accelerating voltage.

4. A method for automated vertical alignment of a sample with respect to the focal point of a cathodoluminescence (CL) mirror in an electron microscope system having a vertical axis coincident with an electron beam generated in the electron microscope system, comprising:
    projecting a light source onto the sample;
    directing light from said source reflected off of the sample by the CL mirror to a detector;
    analyzing said reflected light received by said detector;
    repeatedly adjusting the distance between the sample and the CL mirror to a plurality of distances in the vertical axis and analyzing said reflected light at each of said plurality of distances to determine when said sample is located at said CL mirror focal point based on said analysis of said reflected light at said plurality of distances.

5. The method of claim 4, wherein said CL mirror is a paraboloid mirror or an ellipsoidal mirror.

6. The method of claim 4, wherein said analysis is based on a measurement of the intensity of the reflected light received by the detector at said plurality of distances.

7. The method of claim 4, wherein said detector is a two dimensional imaging device and said analysis is based a comparison of the shape of the reflected light received by the two dimensional imaging device at said plurality of distances with previously stored benchmark images of returned light from said CL mirror or from a second CL mirror having similar optical characteristics as the CL mirror or from images generated from a mathematical model of said CL mirror.

8. The method of claim 6, further comprising predicting the position where the sample will be at the focal point of the CL mirror based on a curve fit of intensity measurements at said plurality of distances.

9. The method of claim 7, further comprising comparing the two dimensional shape of the reflected light received by the two-dimensional imaging device at said plurality of distances with stored images of reflected light received from a mirror having the same optical characteristics as the CL mirror.

10. A method for automated horizontal alignment in the XY plane of an electron microscope (EM) optic axis with respect to the focal point of a cathodoluminescence (CL)

mirror in an electron microscope system having a vertical axis coincident with an electron beam generated in the electron microscope system, comprising:

recording an image with the EM of a region-of-inspection on the CL mirror assembly (MROI), said MROI having a first XY distance to the focal point of the CL mirror;

calculating a second distance in the XY plane to change either the CL mirror position or the EM optic axis based on a measured XY distance between a specific point on the MROI and the EM optic axis as recorded in said image, and said first XY distance between the MROI and the CL mirror focal point;

changing the horizontal position of the CL mirror by said second distance in the XY plane, or changing the electron microscope optic axis by said second distance in the XY plane, to align said CL mirror focal point and said electron microscope optic axis with each other in the XY plane.

11. The method of claim 10 where the MROI is on the top surface of said CL mirror assembly.

12. The method of claim 10 where the MROI is a feature machined on said CL mirror assembly.

13. The method of claim 10 where said first distance between the MROI and said CL mirror focal point is determined by:

adjusting a sample stage in the EM to place a calibration sample portion at said CL mirror focal point to optimize CL focus;

recording a first image of said calibration sample portion with the EM;

moving the CL mirror such that said MROI can be imaged by the EM;

recording a second image of said MROI with the EM;

calculating the distance between said MROI and said CL mirror focal point using the distance the CL mirror was moved between said first and second EM images and the distance MROI has moved between said first and second EM images.

14. A method for automated vertical alignment of a sample mounted on a moveable sample stage with respect to the focal point of a cathodoluminescence (CL) mirror in an electron microscope system having a vertical axis coincident with an electron beam generated in the electron microscope system, comprising:

focusing the EM on the sample surface;

recording a first working distance from the EM optics to the sample surface;

recording a Z axis position of the sample stage;

focusing the EM on a reference mark on the CL mirror;

recording a second working distance from the EM optics to the reference mark on the CL mirror;

calculating a distance to move the sample stage in the Z axis to align the CL mirror focal point with the sample surface, wherein said calculation is based in part on said first and second working distances and a predetermined distance in the Z axis from the CL mirror focal point to the reference mark on the CL mirror.

15. The method of claim 14, wherein said CL mirror is a paraboloid mirror or an ellipsoidal mirror.

16. The method of claim 14 further comprising limiting movement of the sample stage to less than said calculated distance to prevent a collision of the sample with the CL mirror based on predetermined measurements of the sample and the CL mirror in the Z axis.

* * * * *